(12) United States Patent
Jin

(10) Patent No.: US 10,615,239 B2
(45) Date of Patent: Apr. 7, 2020

(54) INTEGRATION OF DISPLAY SCREEN AND OPTICAL FINGERPRINT SENSOR

(71) Applicant: GUANGDONG OPPO MOBILE TELECOMMUNICATIONS CORP., LTD., Dongguan, Guangdong (CN)

(72) Inventor: Yong Jin, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 75 days.

(21) Appl. No.: 15/790,677

(22) Filed: Oct. 23, 2017

(65) Prior Publication Data

US 2018/0261661 A1     Sep. 13, 2018

(30) Foreign Application Priority Data

Mar. 7, 2017   (CN) .......................... 2017 1 0132218
Mar. 7, 2017   (CN) ..................... 2017 2 0219668 U

(51) Int. Cl.
| | | |
|---|---|---|
| *H01L 27/32* | (2006.01) | |
| *H04M 1/02* | (2006.01) | |
| *G06K 9/00* | (2006.01) | |
| *G06F 3/041* | (2006.01) | |
| *G02F 1/1335* | (2006.01) | |

(52) U.S. Cl.
CPC .... *H01L 27/3267* (2013.01); *G02F 1/133602* (2013.01); *G06F 3/041* (2013.01); *G06K 9/00* (2013.01); *G06K 9/0004* (2013.01); *G06K 9/00006* (2013.01); *H01L 27/32* (2013.01); *H01L 27/323* (2013.01); *H04M 1/026* (2013.01); *G02F 2201/44* (2013.01); *H04M 1/0266* (2013.01); *H04M 1/0277* (2013.01); *H04M 2250/12* (2013.01)

(58) Field of Classification Search
CPC ............... G06F 3/041; G02F 1/133602; H01L 27/3267; G06K 9/00563
See application file for complete search history.

(56) References Cited

U.S. PATENT DOCUMENTS

| | | |
|---|---|---|
| 2010/0220900 A1 | 9/2010 | Orsley |
| 2012/0162099 A1 | 6/2012 | Yoo et al. |
| 2013/0222349 A1 | 8/2013 | Baek et al. |
| 2014/0047706 A1 | 2/2014 | Shaikh et al. |
| 2015/0074615 A1 | 3/2015 | Han et al. |
| 2015/0169163 A1 | 6/2015 | Lee et al. |
| 2015/0310251 A1 | 10/2015 | Wyrwas et al. |

(Continued)

FOREIGN PATENT DOCUMENTS

| | | |
|---|---|---|
| CN | 102566840 A | 7/2012 |
| CN | 205068352 U | 3/2016 |

(Continued)

*Primary Examiner* — Kevin M Nguyen
(74) *Attorney, Agent, or Firm* — Young Basile Hanlon & MacFarlane, P.C.

(57) ABSTRACT

A display screen, a display screen assembly, and a terminal are provided. The display screen has a primary display area, a secondary display area, and an optical fingerprint module. The secondary display area is a transparent display area. The optical fingerprint module is positioned on a rear side of the display screen and is configured to identify a fingerprint on the secondary display area.

18 Claims, 14 Drawing Sheets

(56) References Cited

U.S. PATENT DOCUMENTS

| | | | |
|---|---|---|---|
| 2016/0004899 A1* | 1/2016 | Pi | G06F 1/1626 |
| | | | 345/173 |
| 2016/0098140 A1 | 4/2016 | Lee et al. | |
| 2016/0266695 A1* | 9/2016 | Bae | G06F 1/1643 |
| 2017/0154582 A1 | 6/2017 | Seen et al. | |
| 2017/0215273 A1* | 7/2017 | Kim | H01P 3/026 |
| 2017/0270339 A1 | 9/2017 | Zou | |

FOREIGN PATENT DOCUMENTS

| | | | |
|---|---|---|---|
| CN | 105844233 A | 8/2016 | |
| CN | 205899564 U | 1/2017 | |
| CN | 106774689 A | 5/2017 | |
| EP | 3065124 A1 | 9/2016 | |
| TW | 201224634 A | 6/2012 | |
| TW | 201507517 A | 2/2015 | |
| TW | 201606554 A | 2/2016 | |
| TW | 201610826 A | 3/2016 | |

* cited by examiner

INTEGRATION OF DISPLAY SCREEN AND OPTICAL FINGERPRINT SENSOR

CROSS REFERENCE TO RELATED APPLICATIONS

This application is a non-provisional patent application, which claims priority to Chinese Patent Application No. 201710132218.6, filed on Mar. 7, 2017 and Chinese Patent Application No. 201720219668.4, filed on Mar. 7, 2017. The entire disclosures of the above applications are incorporated herein by reference.

FIELD OF THE DISCLOSURE

The present disclosure relates to terminals, and more particularly to a display screen, a display screen assembly, and a terminal.

BACKGROUND OF THE DISCLOSURE

Terminals, such as smart phones, tablet personal computers (PCs), notebook PCs, and personal digital assistants (PDAs), include display screens configured to provide images or videos for users.

Such terminals can include various functions, as well as display functions, such as camera functions, user identifying functions, fingerprint recognizing functions, and the like. With development of intelligent communicating technologies, terminals having large display screens are popular.

At present, the terminals are generally equipped with the fingerprint recognizing functions. Therefore, terminals also have non-display areas, where installing holes are formed in the non-display areas to install fingerprint recognizing modules. This results in that in a fixed-sized terminal, a screen display area of the terminal is limited due to the need for the non-display area for defining the installing hole for accommodating the fingerprint recognizing module.

DESCRIPTION OF THE DRAWINGS

In order to more clearly describe embodiments of the present disclosure, drawings required to be used for the embodiments are simply described hereinafter. Apparently, the drawings described below only illustrate some embodiments of the present disclosure. Those skilled in the art can obtain other drawings based on these drawings disclosed herein without creative effort.

DETAILED DESCRIPTION OF THE PREFERRED EMBODIMENTS

Figure 1:
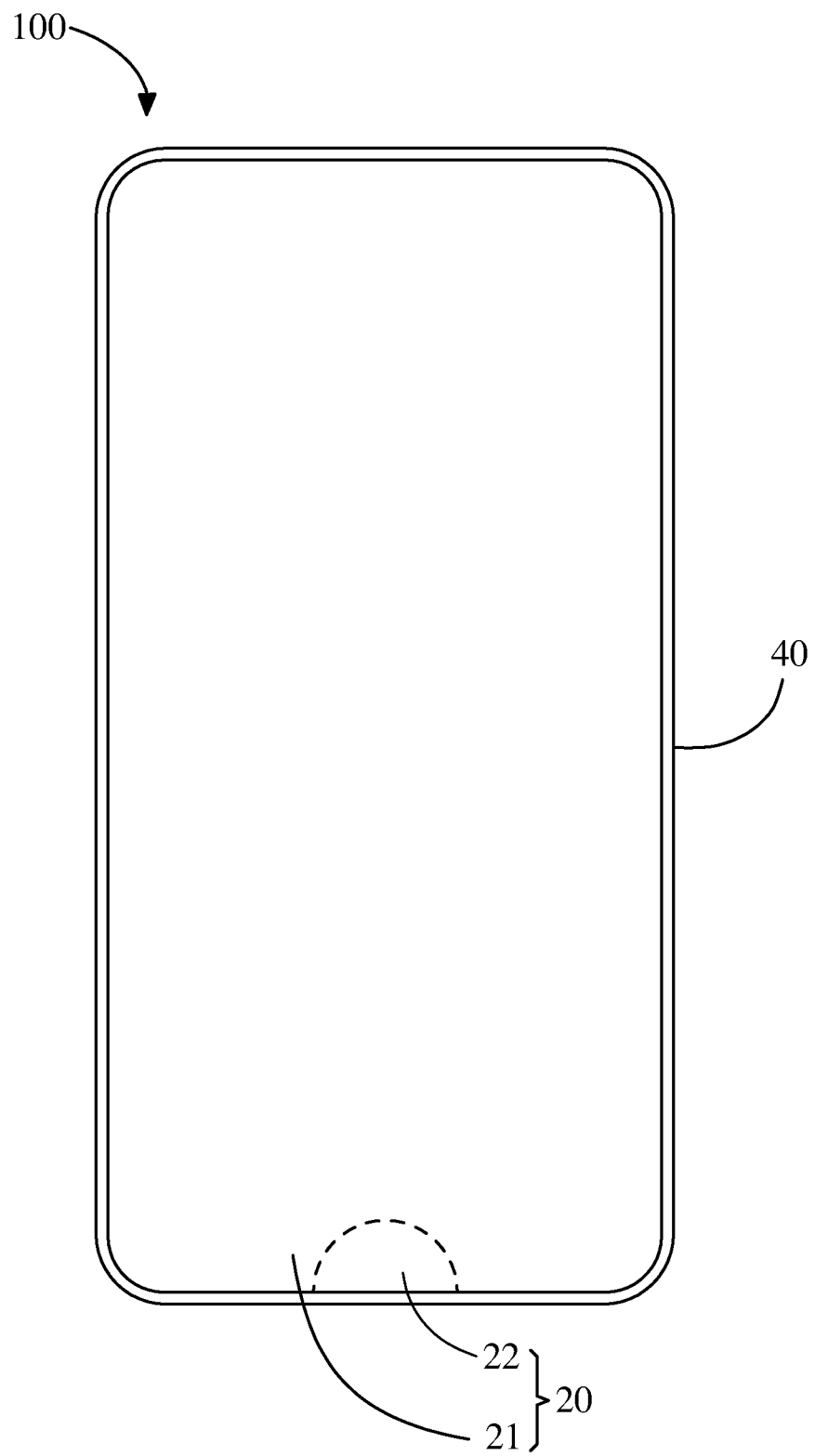
FIG. 1 is a schematic plan view illustrating a terminal according to an embodiment of the present disclosure.

The technical solutions in the embodiments of the present disclosure will be described in detail below in combination with the accompanying drawings in the embodiments of the present disclosure. Apparently, the described embodiments are merely part of the present disclosure, and are not all embodiments. All other embodiments obtained by those of ordinary skill in the art, based on the embodiments in the present disclosure, without making creative work are within the scope of the present disclosure.

The terms "first", "second", "third", etc. (if present) in the specification and claims of the present disclosure and in the above figures are intended to distinguish between similar objects, but not necessarily for describing a particular sequential or priorities. It should be understood that the objects described herein are interchangeable where appropriate. In addition, the terms "comprising", "having" and any variations thereof are intended to cover non-exclusive inclusion.

FIGS. 1 to 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. Reference will now be made in detail to exemplary embodiments, examples of which are illustrated in the accompanying drawings. Also, a terminal according to exemplary embodiments will be described in detail with reference to the accompanying drawings. Identical reference numerals in the drawings denote identical elements.

While such terms as "first," "second," etc., may be used to describe various components, such components must not be limited to the above terms. The above terms are used only to distinguish one component from another. For example, a first element could be termed a second element, and, similarly, a second element could be termed a first element, without departing from the scope of exemplary embodiments. As used herein, the term "and/or", includes any and all combinations of one or more of the associated listed items.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. Like reference numerals in the drawings denote like elements.

Figure 2:
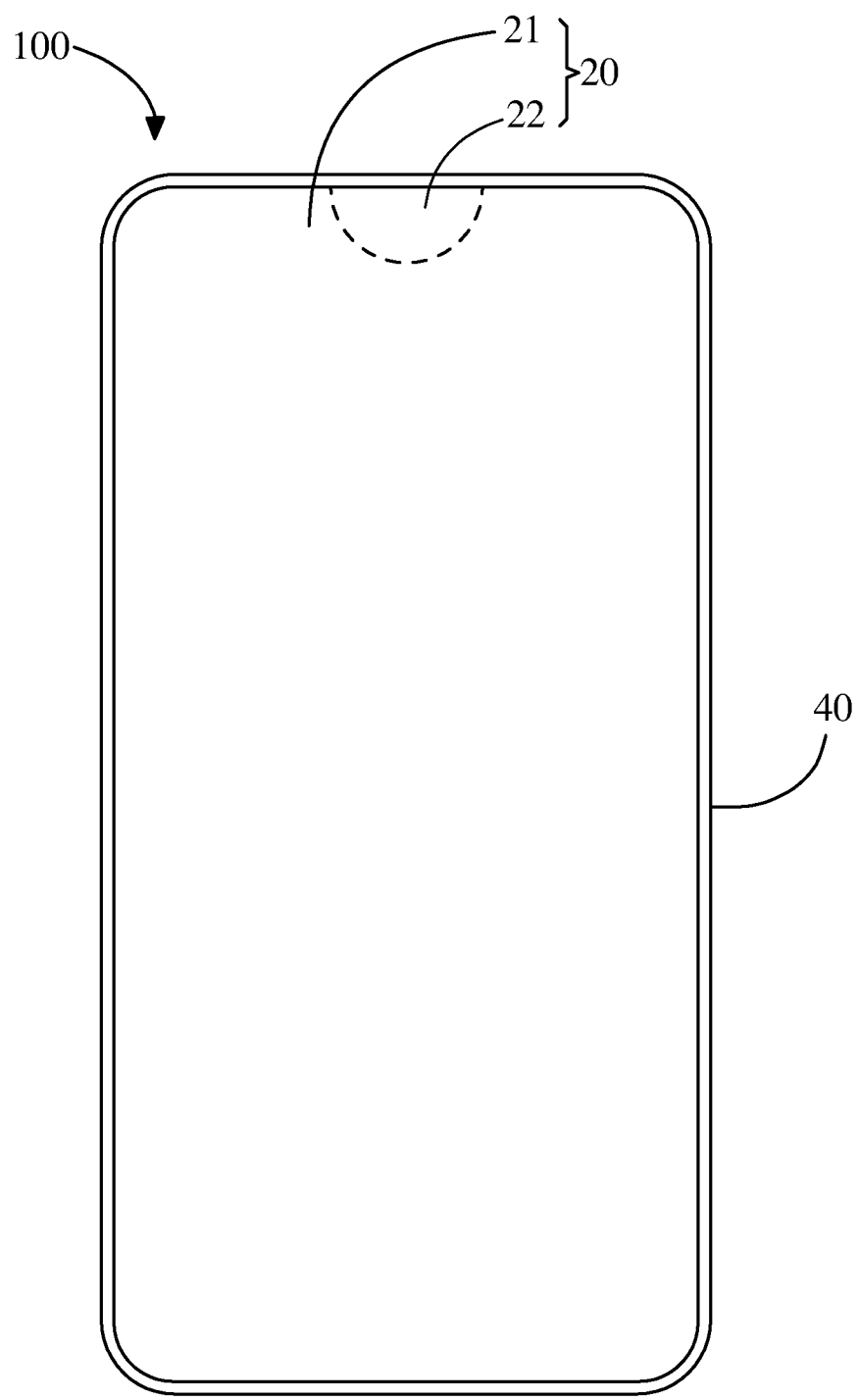
FIG. 2 is another schematic plan view illustrating a terminal according to an embodiment of the present disclosure.

FIG. 1 is a front view illustrating a terminal 100 according to a schematic embodiment of the present disclosure. FIG. 2 is a front view illustrating a terminal 100 according to another schematic embodiment of the present disclosure. In FIGS. 1 and 2, a smart phone is used as an embodiment of the terminal 100. However, the terminal including a display screen 20, such as a tablet personal computer (PC), a notebook PC, and a personal digital assistant (PDA) can be also used as other embodiments.

FIG. 1 to FIG. 4 illustrate that the terminal 100 according to one embodiment can include a display screen 20, an optical fingerprint module 60, and an outer casing 40. The display screen 20 can include a first display area 21 and a second display area 22.

The display screen 20 can be received in the outer casing 40. The outer casing 40 can be a single component or include a plurality of assembly components. The outer casing 40 can be made from at least one of plastic materials, ceramic materials, and metal materials.

The display screen 20 is configured to display electronic files. The display screen 20 can display information such as images, videos, and texts. The display screen 20 can include a front surface configured to display the information and a back surface opposite to the front surface.

The display screen 20 can include a first display area 21 and a second display area 22. The first display area 21 can display information such as images, videos, and texts. The second display area 21 can display information such as images, videos, and texts.

In one embodiment, the first display area 21 and the second display area 22 can cooperate to display an entire screen. For example, when an image is displayed, the first display area 21 can display a part of the image and the second display area 22 can display a remaining part of the image. When the first display area 21 and the second display area 22 cooperate to display an entire screen, the first display area 21 can be used to display a large part of image information and the second display area 22 can be used to display a remaining part of the image information.

In one embodiment, a display image is formed by the first display area 21 and the second display area 22, i.e., an entire screen can be formed by an image displayed by the first display area 21 and an image displayed by the second display area 22.

In one embodiment, when the first display area 21 and the second display area 22 cooperate to display an entire screen, image information to be displayed by each of the first display area 21 and the second display area 22 can be assigned according to a size of the first display area 21 and a size of the second display area 22.

In some embodiments, the first display area 21 and the second display area 22 can further display different images independently and respectively. For example, the first display area 21 displays a first image and the second display area 22 displays a second image. In another example, the first display area 21 displays an interface image and the second display area 22 displays a fingerprint identifying icon, etc.

In one embodiment, in order to improve quality of screen display, the first display area 21 and the second display area 22 are coplanar, i.e., an information display surface of the first display area 21 and an information display surface of the second display area 22 are in a same plane. For example, when a thickness of the first display area 21 is different from a thickness of the second display area 22, it is ensured that the information display surface of the first display area 21 and the information display surface of the second display area 22 are in the same plane at a time of assembly.

Of course in some embodiments, the first display area 21 and the second display area 22 can be also non-coplanar. For example, the first display area 21 is higher than the second display area 22, etc.

Figure 4:
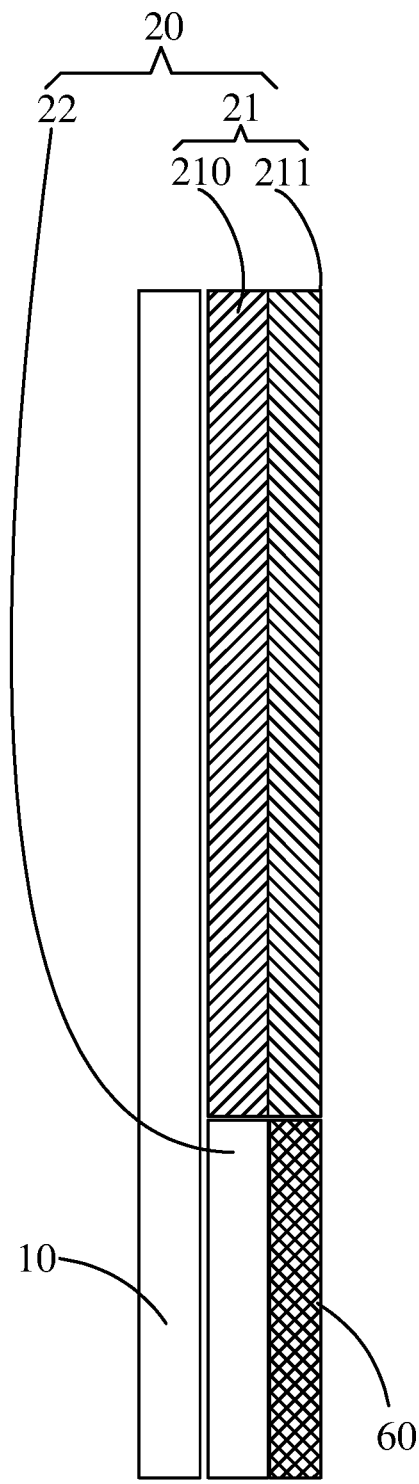
FIG. 4 is a cross-sectional schematic diagram illustrating a display screen assembly according to an embodiment of the present disclosure.

In some embodiments, an area of the second display area 22 is smaller than an area of the first display area 21. FIG. 1 and FIG. 4 illustrate that the area of the second display area 22 is much smaller than the area of the first display area 21. The area of the second display area 22 relates to a size of the optical fingerprint module 60. For example, the larger the optical fingerprint module 60 is, the larger the area of the second display area 22 is for being able to collect (or identify) a fingerprint.

In one embodiment, the first display area 21 surrounds at least a part of the second display area 22. For example, FIG. 1 and FIG. 2 illustrate that a part of the first display area 21 surrounds the second display area 22, and a part of the second display area 22 is surrounded by the first display area 21.

Figure 5:
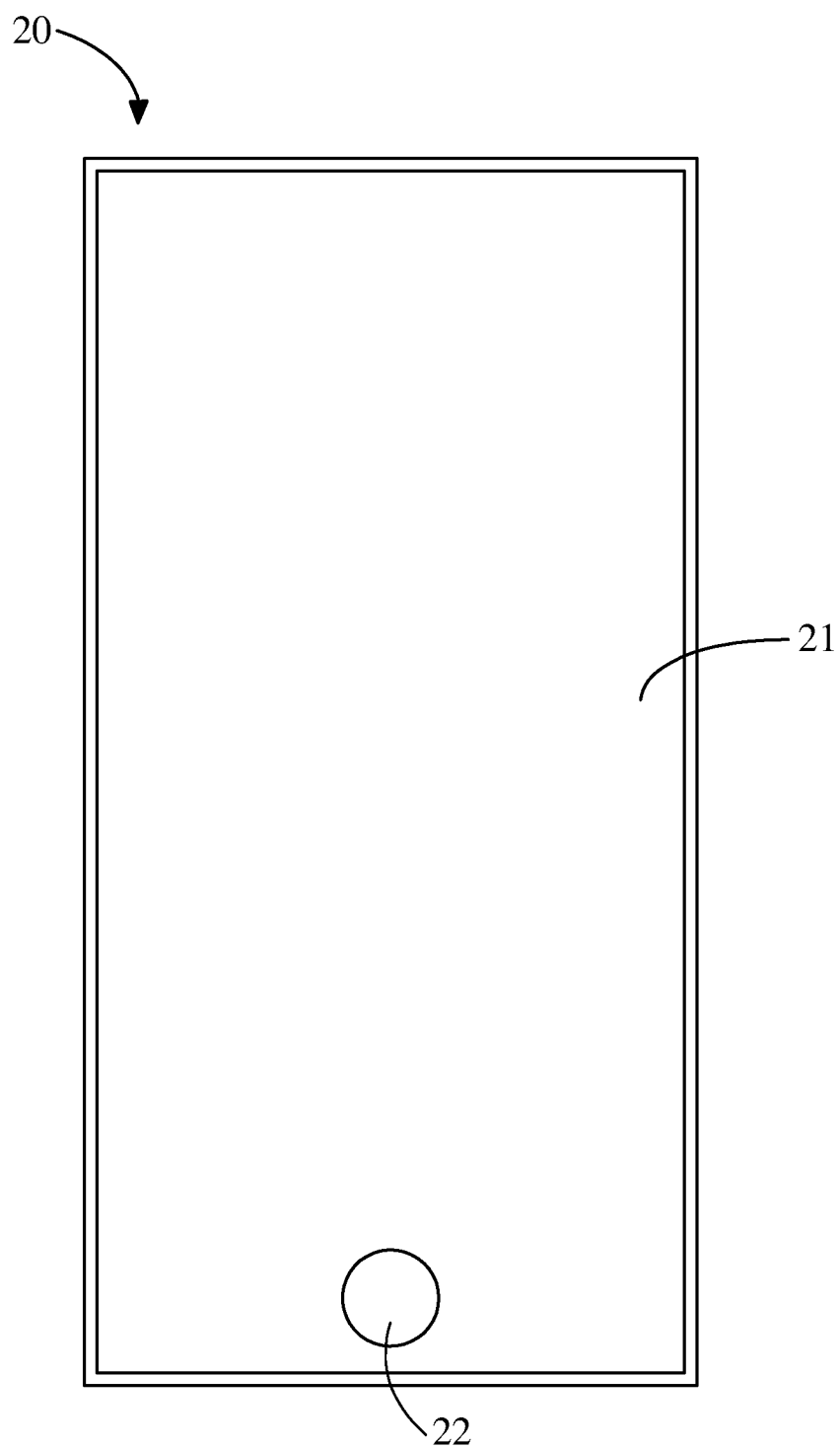
FIG. 5 is a second schematic plan view illustrating a display screen according to an embodiment of the present disclosure.

In some embodiments, the first display area 21 can completely surround the second display area 22, and the second display area 22 is surrounded by the first display area 21. For example, FIG. 5 illustrates that the second display area 22 is completely surrounded by the first display area 21.

In order to improve quality of screen display and simplify a fabricating process of a display screen, in the present embodiment, the second display area 22 can be formed at an edge of the display screen 20. Specifically, the second display area 22 can be directly coupled to the edge of the display screen 20.

Figure 6:
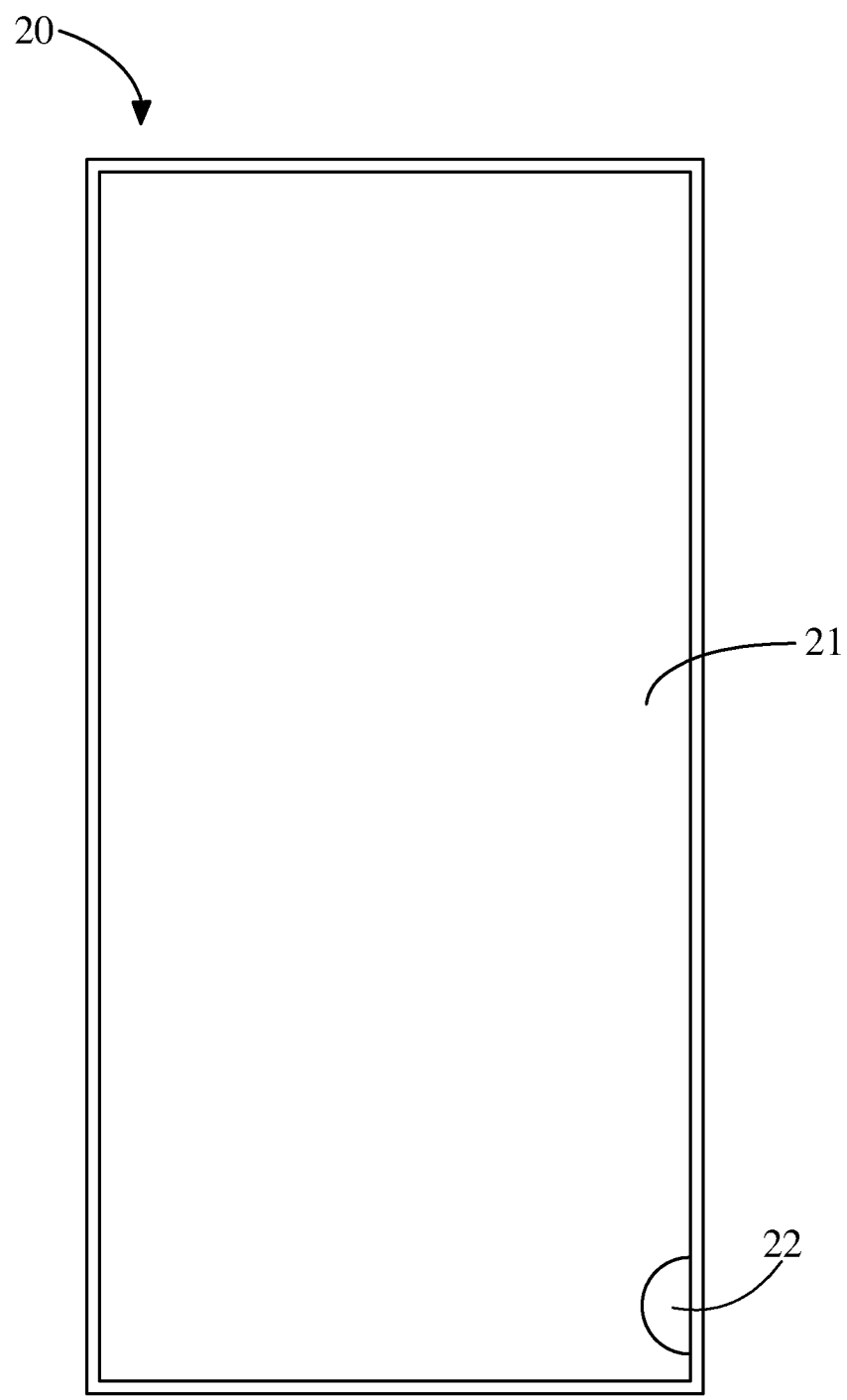
FIG. 6 is a third schematic plan view illustrating a display screen according to an embodiment of the present disclosure.

For example, FIG. 1 illustrates that the second display area 22 is formed at and coupled to a bottom edge of the first display area 21. In another example, FIG. 2 illustrates that the second display area 22 is formed at and coupled to a top edge of the first display area 21. In another example, FIG. 6 illustrates that the second display area 22 is formed at and coupled to a side portion of the first display area 21.

Figure 7:
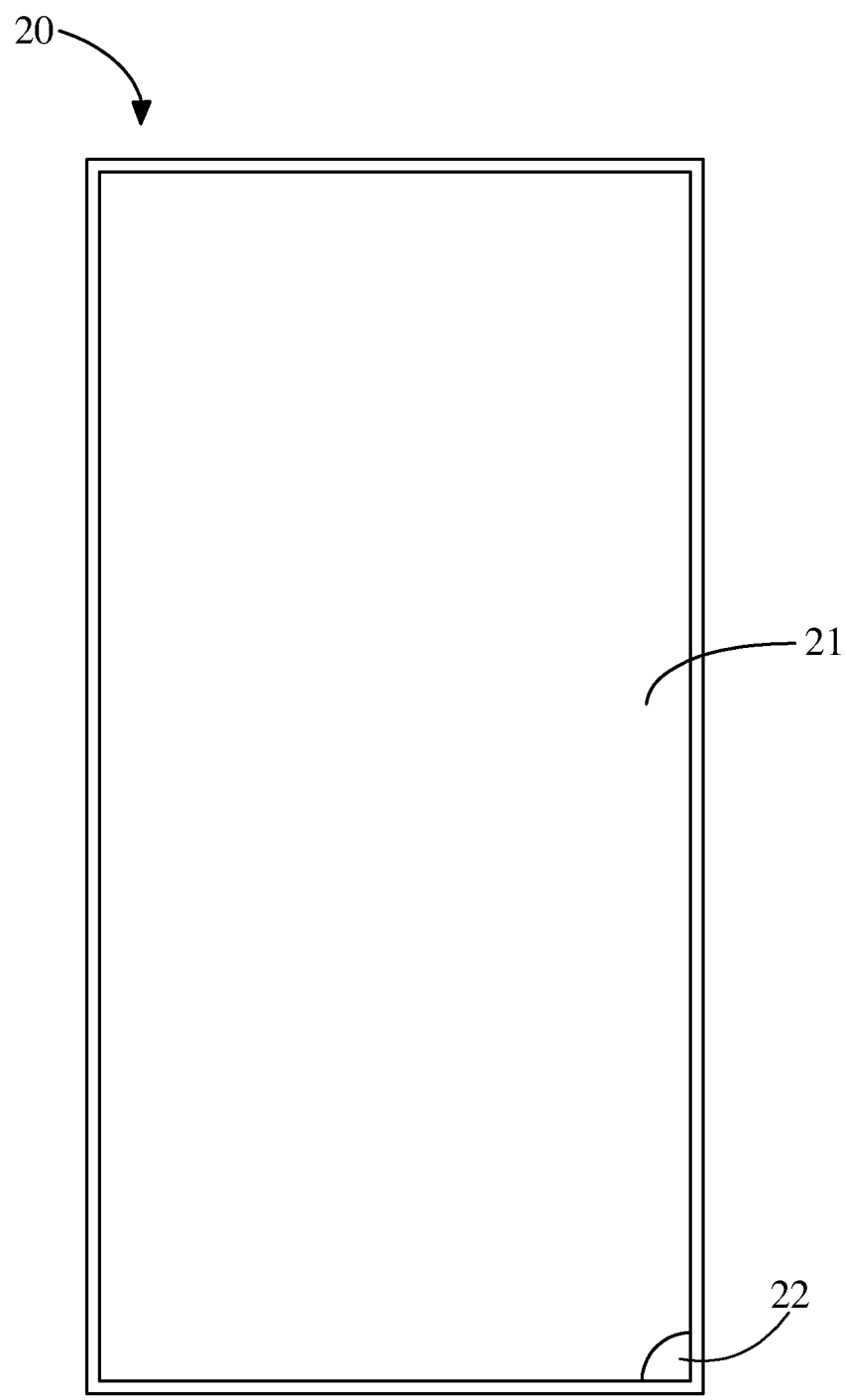
FIG. 7 is a fourth schematic plan view illustrating a display screen according to an embodiment of the present disclosure.

In some embodiments, in order to beautify the display screen, improve quality of screen display, and reduce a fabricating process of a display screen, the second display area 22 can be further disposed at an intersection between a side portion and a bottom portion of the display screen 20. For example, FIG. 7 illustrates that the second display area 22 can be formed at an intersection between the side portion and the bottom portion of the display screen 20, and the second display area 22 is coupled to the side portion and the bottom portion of the display screen 20.

In order to facilitate a user inputting a fingerprint, the second display area 22 can be positioned in a middle of a bottom of the first display area 21 according to the user's habit of using the terminal. In some embodiments, the second display area 22 can be positioned in a middle of a top of the first display area 21, such as illustrated in FIG. 1. Further, the second display area 22 can be disposed in a side of the first display area 21, such as illustrated in FIG. 6.

Figure 8:
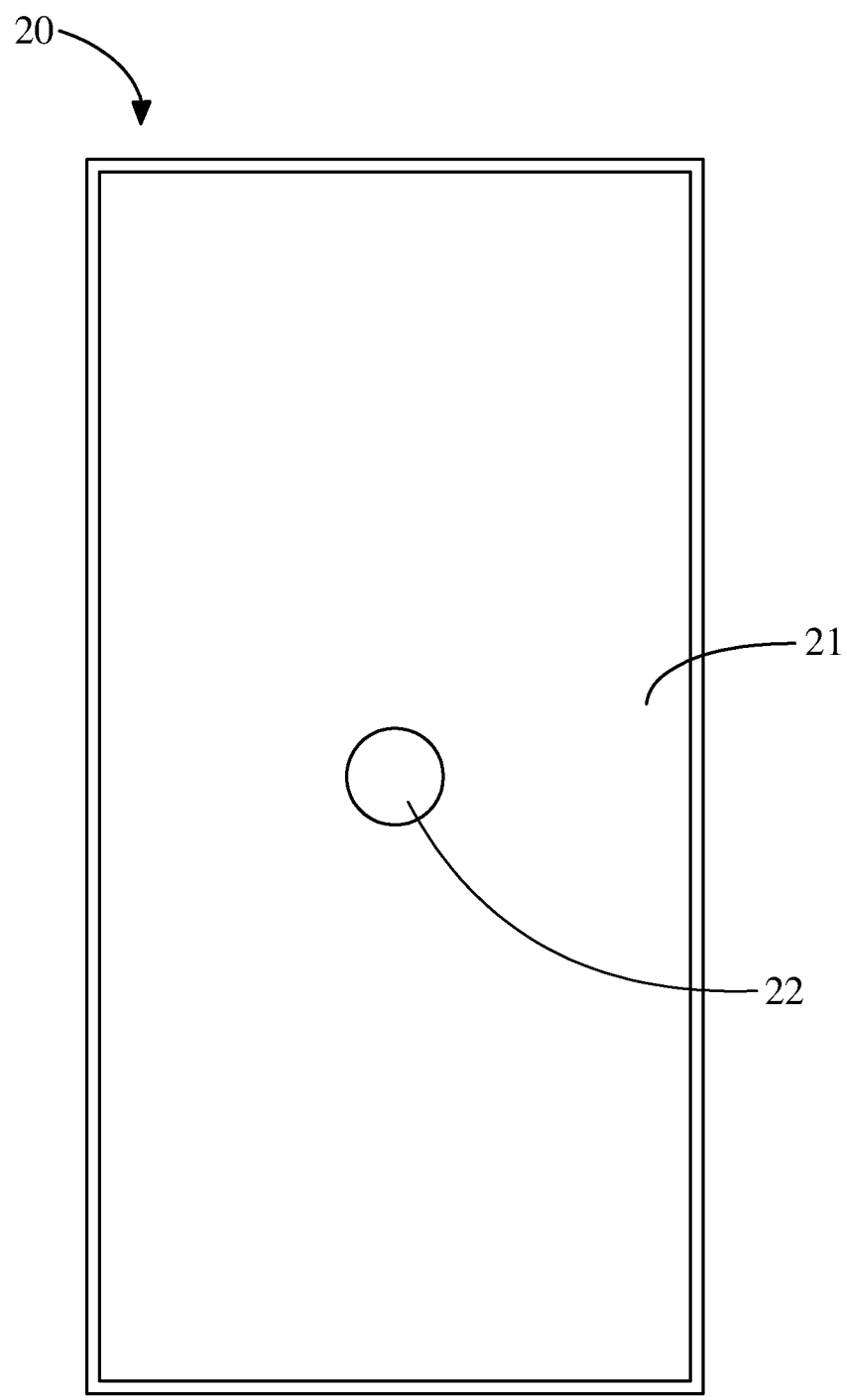
FIG. 8 is a fifth schematic plan view illustrating a display screen according to an embodiment of the present disclosure.

In some embodiments, FIG. 8 illustrates that the second display area 22 can be positioned in a middle of the first display area 21, and the second display area 22 is completely surrounded by the first display area 21.

Figure 3:
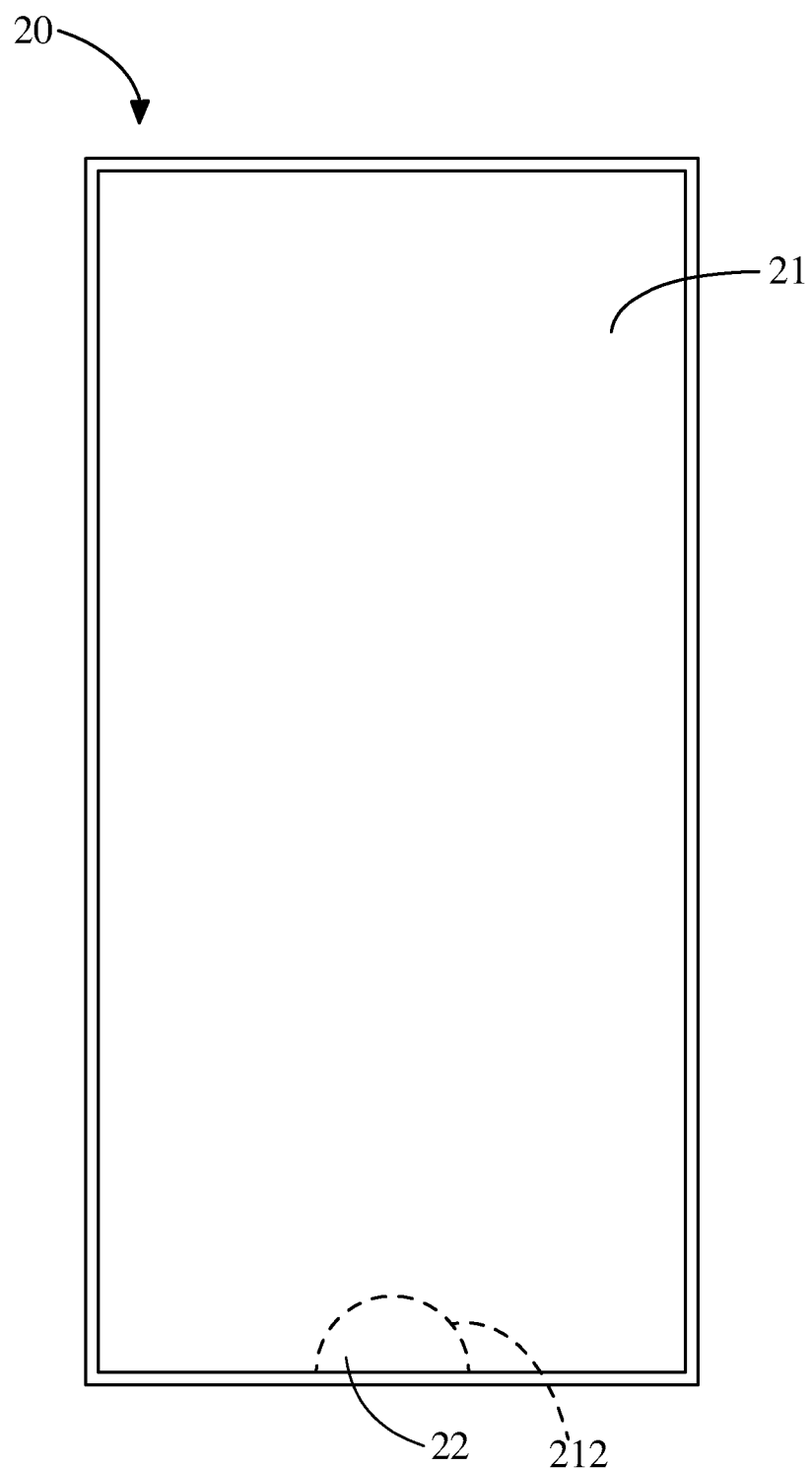
FIG. 3 is a first schematic plan view illustrating a display screen according to an embodiment of the present disclosure.
Figure 9:
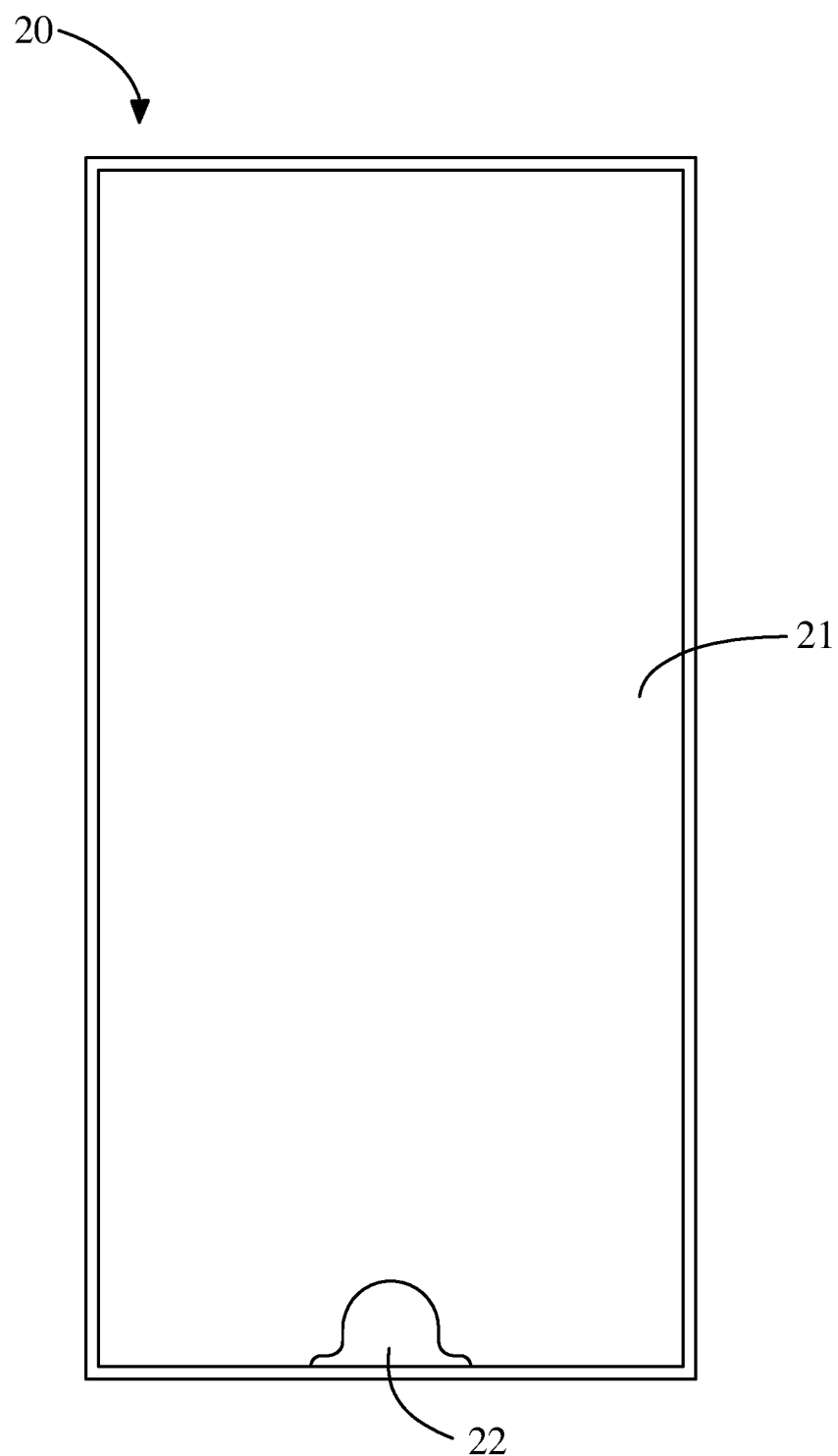
FIG. 9 is a sixth schematic plan view illustrating a display screen according to an embodiment of the present disclosure.

In one embodiment, the second display area 22 may have various contour shapes. For example, the contour shapes can be selected from the group consisting of an arc shape, a rounded rectangle shape, and a rounded square shape. For example, FIG. 1 to FIG. 3 illustrate that the second display area 22 is semi-circular; FIG. 5 and FIG. 8 illustrate that the second display area 22 is circular. In another example, FIG. 9 illustrates that a contour shape of the second display area 22 includes a plurality of arcs.

Figure 10:
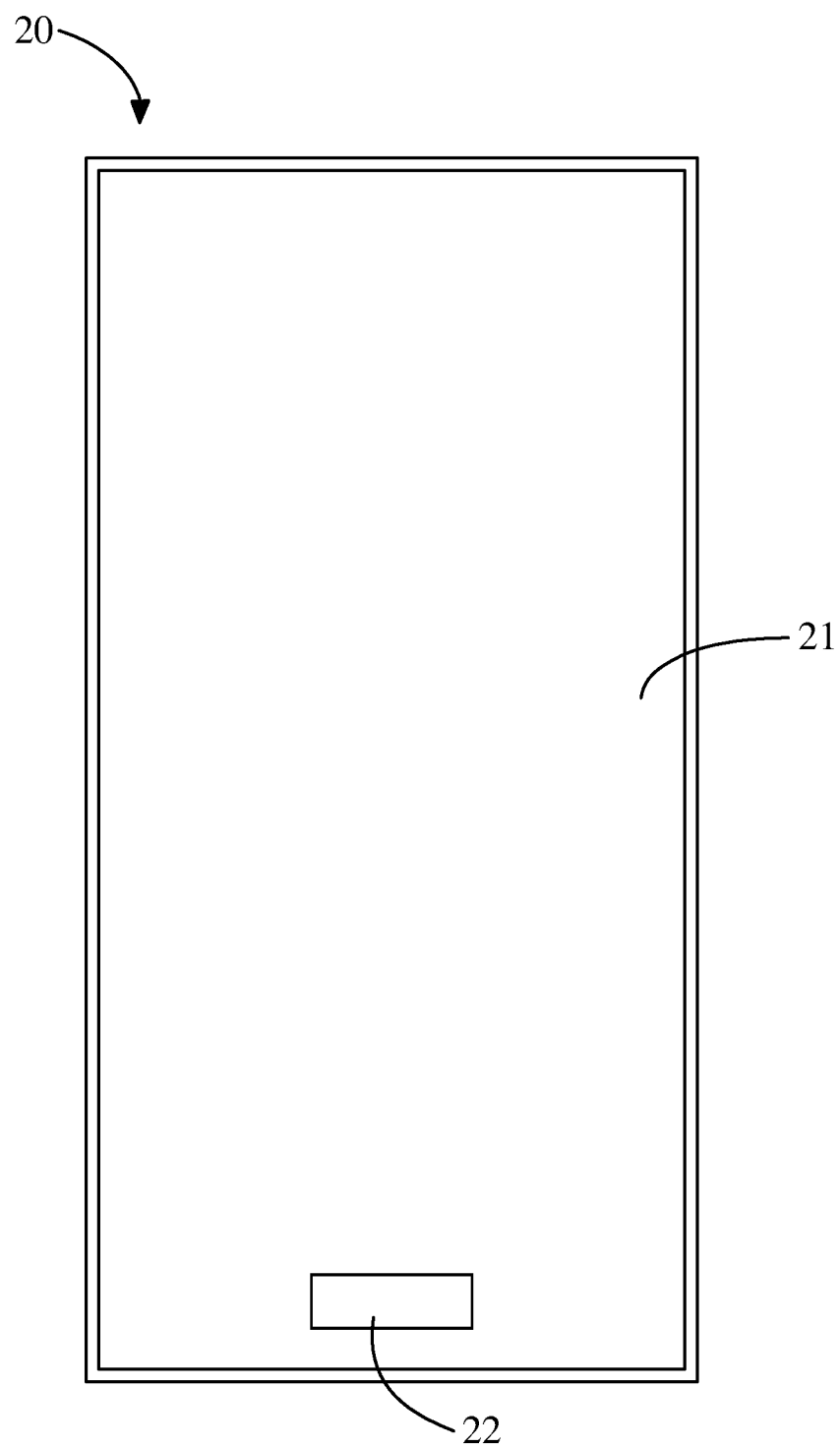
FIG. 10 is a seventh schematic plan view illustrating a display screen according to an embodiment of the present disclosure.

In some embodiments, a contour shape of the second display area 22 can be a rectangular shape. For example, FIG. 10 illustrates that a rectangular second display area 22 is positioned in a bottom of the first display area 21.

In order to enable the optical fingerprint module 60 to collect (or identify) a fingerprint of a user, in one embodiment, the second display area 22 is a transparent display area so that the optical fingerprint module 60 can collect (or identify) the fingerprint of the user by the transparent second display area 22.

FIG. 4 illustrates that the optical fingerprint module 60 on a rear side of the second display area 22 of the display screen 20. A light signal can be emitted toward the second display area 22 by the optical fingerprint module 60. When a fingerprint is put on the second display area 22, the light signal will pass through the transparent second display area 22 and achieve the fingerprint of a finger, and a reflection will be induced accordingly. Therefore, a fingerprint image can be obtained by the optical fingerprint module 60 according to a reflective light signal so as to collect (or identify) a finger information of the user, since brightness of the emitted light signal is different from brightness of a light signal refracted or reflected by ridges on a surface of the finger. Therefore, the fingerprint image can be obtained by the optical fingerprint module 60, according to the reflective light signal. In one embodiment, "front side" means a direction to which a side of the display screen 20 faces, wherein the side of the display screen 20 displays information, and "rear side" means a direction opposite to "front side".

In one embodiment, in a displaying mode a displaying information, such as an image information and so on, can be spliced by the second display area 22 together with the first display area 21. In a fingerprint identifying mode, the second display area 22 is used to achieve fingerprint identifying function. For example, the second display area 22 becomes transparent in the fingerprint identifying mode so that the fingerprint is collected (or identified) by the optical fingerprint module 60.

In some embodiments, in the fingerprint identifying mode the displaying information can be also spliced by the second display area 22 together with the first display area 21. For example, when a video screen for displaying is spliced by the first display area 21 and the second display area 22, a fingerprint can be inputted through the second display area 22 by a user so as to performing fingerprint identification, etc.

Since the display screen 20 has the transparent second display area 22, a fingerprint of a user can be collected (or identified) through the second display area 22 by the optical fingerprint module 60 so as to achieve fingerprint identifying function. There is no need to dispose an independent non-display area for the fingerprint module. A screen ratio of the display screen 20 can be increased so as to achieve a display effect of a large screen.

Figure 11:
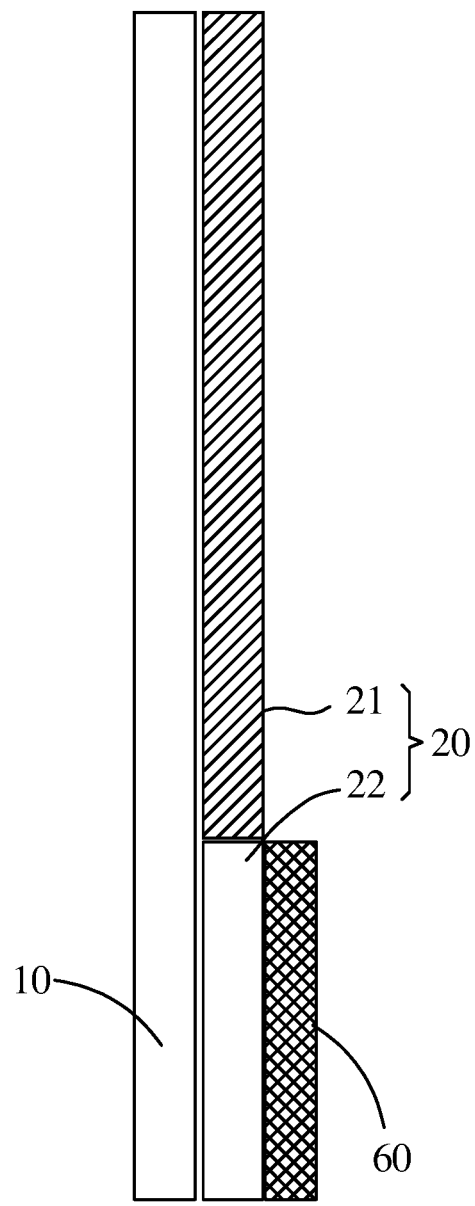
FIG. 11 is another cross-sectional schematic diagram illustrating a display screen assembly according to an embodiment of the present disclosure.

In one embodiment, the first display area 21 and the second display area 22 can be formed in a complete display screen. FIG. 11 illustrates that the display screen 20 is a complete display screen, and the display screen 20 includes a first display area 21 and a transparent second display area 22 which are integrally molded. The optical fingerprint module 60 is disposed on a rear side of the display screen 22.

In some embodiments, the first display area 21 and the second display area 22 can be formed in two display screens, i.e., the display screen 20 is spliced by the two display screens. The display screen 20 can include a primary display screen and a secondary display screen. The first display area 21 is achieved by the primary display screen, and the second display area 22 is achieved by the secondary display screen.

In one embodiment, the second display area 22 can be a transparent display screen with an independent display function, such as an organic light emitting diode (OLED) display screen. The first display area 21 can be a display screen with an independent display function, such as a liquid crystal display (LCD) screen. For example, FIG. 4 illustrates that the first display area 21 can be a non-transparent display screen, and the non-transparent display screen can include a display module 210 and a backlight module 211. The second display area 22 can be a transparent OLED display screen.

In some embodiments, the first display area 21 can include a LCD display module and a LCD backlight module.

In one embodiment, the optical fingerprint module 60 is disposed below the display screen 20, i.e., disposed on a rear side of the display screen 20. In one embodiment, "front side" means a direction to which a side of the display screen 20 faces, wherein the side of the display screen 20 displays information, and "rear side" means a direction opposite to "front side".

In order to collect (or identify) a fingerprint rapidly and improve identifying speed of the fingerprint, in one embodiment, the optical fingerprint module 60 can be positioned below the second display area 22, i.e., on a rear side of the second display area 22. For example, FIG. 4 illustrates that, when the second display area 22 is a transparent OLED display screen, the optical fingerprint module 60 can be positioned on the rear side of the OLED display screen. In one embodiment, the optical fingerprint module 60 can face directly to the second display area 22. For example, an emitting and receiving surface of the optical fingerprint module 60 faces directly to the second display area 22.

In some embodiments, the optical fingerprint module 60 can further be positioned on a rear side of the first display area 21. A light-guiding structure can be disposed below (i.e. on the rear side of) the second display area 22 so as to collect (or identify) a fingerprint of the second display area 22. A light signal can be emitted toward the light-guiding structure by the optical fingerprint module 60, and the light signal is emitted onto the second display area 22 through the light-guiding structure. When the fingerprint of a user is put on the second display area 22, the light signal is reflected by the fingerprint, and the reflected light signal is emitted onto the optical fingerprint module through the light-guiding structure, so as to achieve collecting (or identifying) the fingerprint. The light-guiding structure can be a reflective structure such as a prism, etc.

In some embodiments, the first display area 21 includes an area for placement of a component, wherein the second display area 22 is positioned in the area.

In one embodiment, the component can be a module performing other functions without performing display function. For example, the component can be a sensor module used to emitting a signal or receiving a signal from an external. For example, the component can be a fingerprint module, etc.

In one embodiment, the area can be a hole. FIG. 3 illustrates that a hole 212 can be formed in the first display area 21, and the second display area 22 is positioned in the hole 212. The second display area 22 can be coupled to the hole 212. When the second display area 22 is a transparent display screen, a sidewall of the display screen is coupled to a sidewall of the hole 212. When applied in practice, the transparent display screen and the primary display screen are coplanar. The hole 212 can be formed by a cutting process, such as a computer numerical control (CNC) cutting process, etc.

In one embodiment, the hole 212 may have various shapes. For example, the shapes can be selected from the group consisting of an arc shape, a rounded rectangle shape, and a rounded square shape. FIG. 3 illustrates that the shape of the hole 212 can be semi-circular.

In one embodiment, a contour shape of the second display area 22 fits to a shape of the hole 212. The second display area 22 is positioned in and connected to the hole 212, so as to ensure a complete property of the display screen 20.

In practical applications, when the first display area 21 is a primary display screen and the second display area 22 is a transparent display screen, the transparent display screen can be installed in the hole 212, and the transparent display screen and the primary display screen are coplanar. A complete display screen 20 can be spliced by the primary display screen and the transparent display screen. A user can feel that the display screen 20 is an integrally formed display screen by viewing from a front side of the display screen 20, wherein the transparent display screen is connected to a side wall of the hole 212 in the primary display screen. For example, a gap between the transparent display screen and the primary display screen is dispensed by a dispensing process, so as to closely connect the transparent display screen to the primary display screen.

In some embodiments, FIG. 4 illustrates that, when the first display area 21 is a non-transparent display screen and the non-transparent display screen includes a display module 210 and a backlight module 211, the hole 212 extends through the display module 210 and the backlight module 211.

In order to save a design space of the terminal, optionally, the backlight module 211 can be disposed partially around the optical fingerprint module 60. FIG. 4 illustrates that the backlight module 211 is disposed partially around the optical fingerprint module 60, and the optical fingerprint module 60 is coupled to a bottom edge of the backlight module 211.

Figure 12:
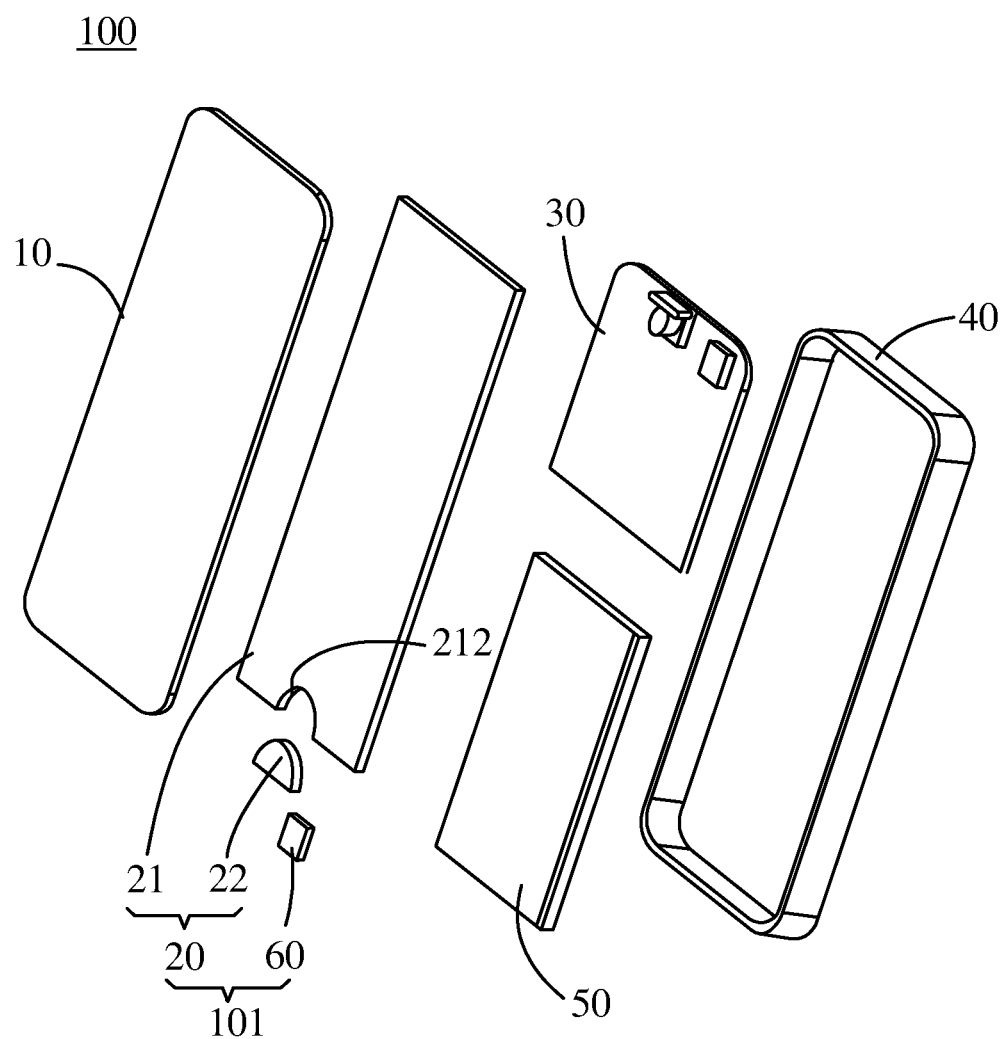
FIG. 12 is an exploded schematic diagram illustrating a terminal according to an embodiment of the present disclosure.

FIG. 12 is an exploded schematic diagram illustrating a terminal 100. FIG. 12 illustrates that the terminal 100 can include a cover plate 10, a display screen 20, a printed circuit board 30, and an outer casing 40. The terminal 100 can further include a battery 50. The display screen 20 can be electrically coupled to the printed circuit board 30 through a flexible printed circuit board.

The cover plate 10 can be disposed in front of the display screen 20. A front surface of the display screen 20 can be protected by the cover plate 10, and a displayed information on the display screen 20 exposes to the outside.

Figure 13:
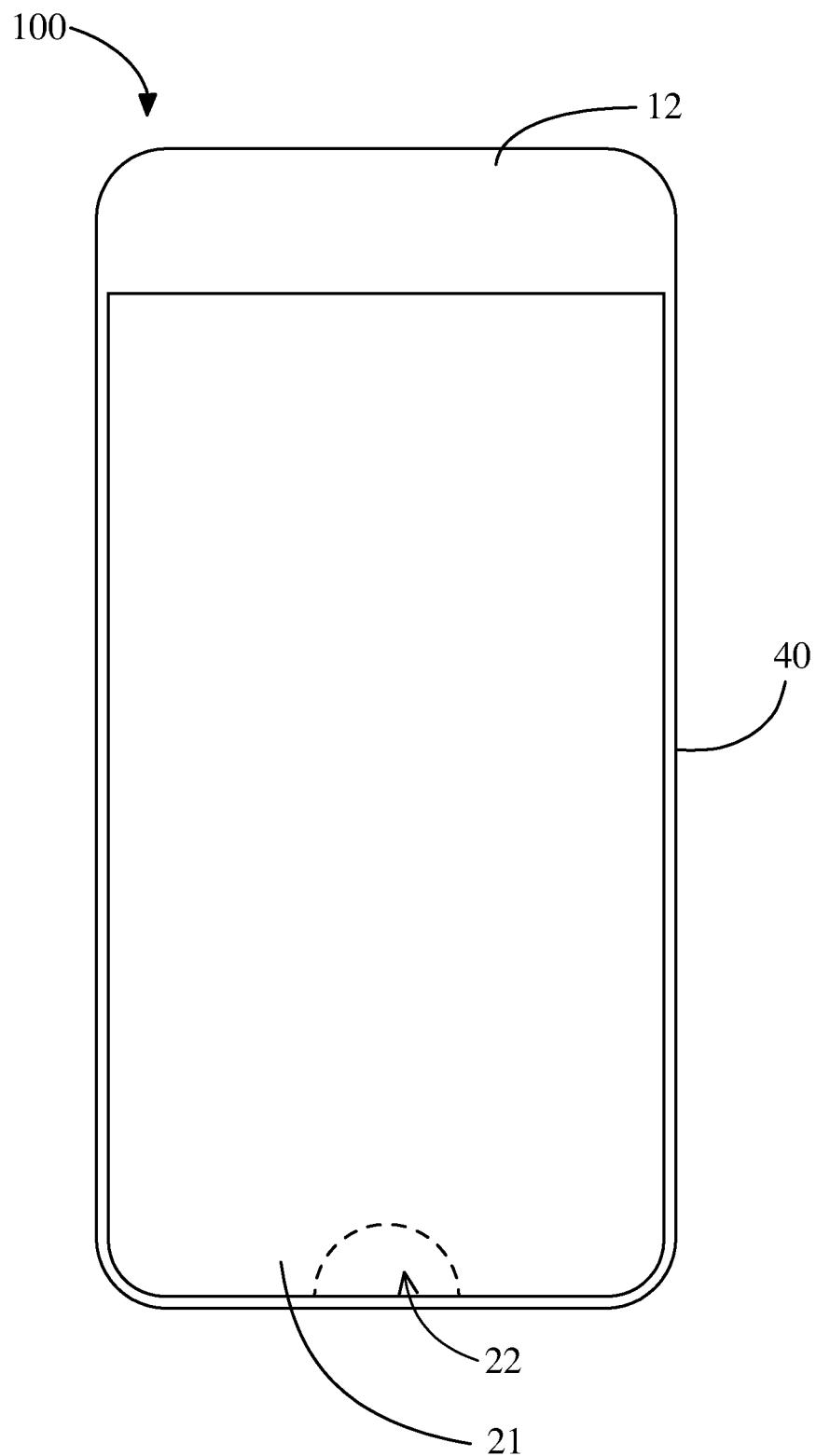
FIG. 13 is a yet another exploded schematic diagram illustrating a terminal according to an embodiment of the present disclosure.
Figure 14:
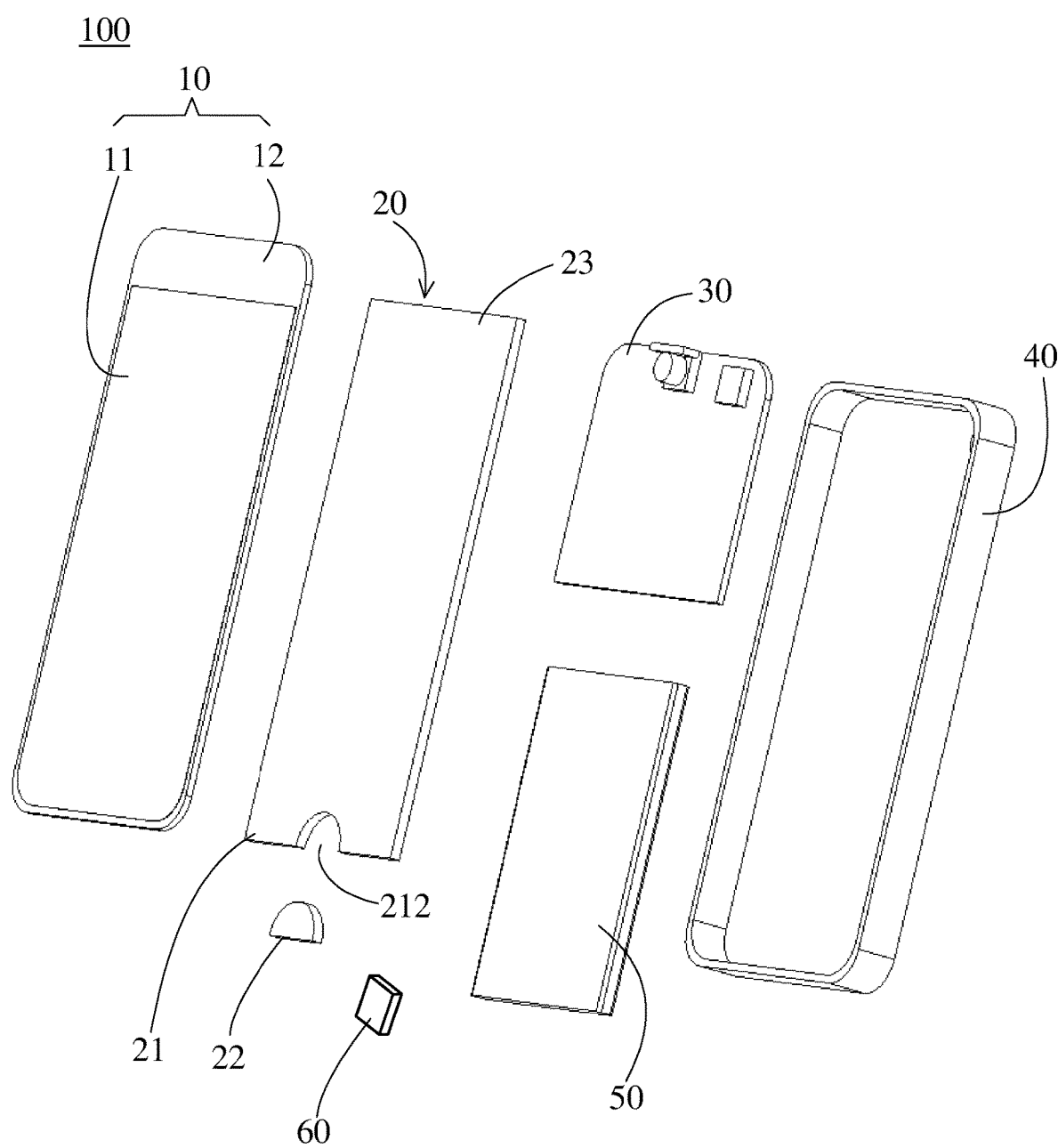
FIG. 14 is another exploded schematic diagram illustrating a terminal according to an embodiment of the present disclosure.

In some embodiments, FIG. 13 and FIG. 14 illustrate that the cover plate 10 may further have an exposing area 11 used to expose information displayed by the display screen 20 and an non-exposing area 12 used to block external visibility. The non-exposing area 12 can include a light shielding layer such as a black pad layer, so as to enable an inner part of the terminal 100 invisibly. In some embodiments, the light shielding layer is an ink layer.

FIG. 13 and FIG. 14 illustrate that the display screen 20 can include a non-display area 23 without displaying information. The non-display area 23 can be disposed on an outer side of the first display area 21. The non-display area 23 can be used to dispose an integrated circuit (IC). The IC is used to control information display of the display screen 20. Or, the non-display area 23 can be used to dispose functional devices such as a proximity sensor, a front camera, etc.

The non-exposing area 12 of the cover plate 10 can be disposed in front of the non-display area 23 of the display screen 20, so as to avoid the non-display area 23 of the display screen 20 being viewed from outside.

In some embodiments, FIG. 1 illustrates that the display screen 20 may not include a non-display area, i.e., the display screen 20 only includes a first display area 21 and a second display area 22. At this time, the IC for controlling display information of the display screen 20 may be disposed in a thickness direction of the display screen 20 or the like.

FIG. 12 illustrates that in one embodiment, a display panel assembly 101 may include the display screen 20 and the optical fingerprint module 60.

As described above, in the display screen, the display screen assembly, and the terminal provided by embodiments of the present disclosure, the optical fingerprint module is configured to collect (or identify) a fingerprint by forming at least one transparent second display area on the display screen, such that it is no need to dispose the non-display areas for the fingerprint recognizing module, where the non-display areas do not display images. An area of display area can be improved effectively so as to achieve a display effect of a large screen.

To promote understanding of one or more exemplary embodiments, reference has been made to the exemplary embodiments illustrated in the drawings, and specific language has been used to describe these embodiments. However, no limitation of the scope of the inventive concept is intended by this specific language, and exemplary embodiments should be construed to encompass all exemplary embodiments that would normally occur to one of ordinary skill in the art.

The words "mechanism," "element," "means," and "configuration" are used broadly and are not limited to mechanical or physical embodiments, but can include software routines in conjunction with processors, etc.

The particular implementations shown and described herein are illustrative examples of the disclosure and are not intended to otherwise limit the scope of the disclosure in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the disclosure unless the element is specifically described as "essential" or "critical". The words used herein "including" "having" or the like are used to express an openness in terms of technology.

The use of the terms "a" and "an" and "the" and similar referents in the context of describing the inventive concept (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Also, the steps of all methods described herein can be performed in any suitable order unless otherwise indicated herein or otherwise clearly contradicted by context. The inventive concept is not limited to the described order of the steps. The use of any and all examples, or exemplary language (e.g., "such as") provided herein, is intended merely to better illuminate the inventive concept and does not pose a limitation on the scope of the inventive concept unless otherwise claimed. Numerous modifications and adaptations will be readily apparent to one of ordinary skill in the art without departing from the spirit and scope.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. Although the present disclosure has been described with an exemplary embodiment, various changes and modifications may be suggested to one skilled in the art. It is intended that the present disclosure encompass such changes and modifications as fall within the scope of the appended claims.

The invention claimed is:

1. A display screen for an electronic device, comprising:
a first display area, wherein the first display area is a liquid crystal display (LCD);
a second display area, wherein the second display area is a transparent organic light emitting diode (OLED) display; and
an optical fingerprint sensor positioned on a rear side of the display screen and positioned below the second display area, wherein the optical fingerprint sensor is configured to identify a fingerprint on the second display area,
wherein when an image is shown by the electronic device, the first display area and the second display area cooperatively display the image;
wherein the first display area comprises an area for placement of a component, wherein the second display area is positioned in the area; and
wherein the area is a hole, the first display area is a non-transparent display screen comprising a display panel and a LCD backlight, and the hole extends through the display panel and the LCD backlight.

2. The display screen according to claim 1, wherein the first display area and the second display area are coplanar, and an area of the second display area is smaller than an area of the first display area.

3. The display screen according to claim 1, wherein the first display area surrounds at least a part of the second display area.

4. The display screen according to claim 1, wherein the second display area is positioned in an edge of the display screen.

5. The display screen according to claim 1, wherein the second display area is positioned in a middle of a bottom of the first display area.

6. The display screen according to claim 1, wherein a contour shape of the second display area is selected from the group consisting of an arc shape, a rounded rectangle shape, and a rounded square shape.

7. The display screen according to claim 1, wherein the second display area is a transparent display screen with an independent display function.

8. The display screen according to claim 7, wherein the transparent display screen is a transparent organic light emitting diode display screen.

9. The display screen according to claim 1, wherein a thickness of the first display area is different from a thickness of the second display area.

10. A display screen assembly for an electronic device, comprising:
a display screen for an electronic device, comprising:
a first display area, wherein the first display area is a liquid crystal display (LCD);
a second display area, wherein the second display area is a transparent organic light emitting diode (OLED) display; and
an optical fingerprint sensor positioned on a rear side of the second display area and positioned below the second display area, wherein the optical fingerprint sensor is configured to identify a fingerprint on the second display area,
wherein when an image is shown by the electronic device, the first display area and the second display area cooperatively display the image;
wherein the first display area comprises a hole, and the second display area and the optical fingerprint sensor are positioned in the hole; and
wherein the first display area is a non-transparent display screen comprising a display panel and a LCD backlight, and the hole extends through the display panel and the LCD backlight.

11. The display screen assembly according to claim 10, wherein the LCD backlight surrounds at least a part of the optical fingerprint sensor.

12. The display screen assembly according to claim 10, wherein a thickness of the first display area is different from a thickness of the second display area.

13. A terminal, comprising:
a display screen for an electronic device, comprising:
a first display area, wherein the first display area is a liquid crystal display (LCD);
a second display area, wherein the second display area is a transparent organic light emitting diode (OLED) display; and
an optical fingerprint sensor positioned on a rear side of the display screen and positioned below the second display area, wherein the optical fingerprint sensor is configured to identify a fingerprint on the second display area; and
a printed circuit board electrically coupled to the display screen, wherein when an image is shown by the electronic device, the first display area and the second display area cooperatively display the image;

wherein the first display area comprises an area for placement of a component, wherein the second display area is positioned in the area; and wherein the area is a hole, the first display area is a non-transparent display screen comprising a display panel and a LCD backlight, and the hole extends through the display panel and the LCD backlight.

14. The terminal according to claim 13, further comprising:

a cover plate positioned in front of the display screen and covers the display screen; and an outer casing, wherein the display screen and the printed circuit board are disposed in the outer casing.

15. The terminal according to claim 13, wherein the optical fingerprint sensor is positioned on a rear side of the second display area.

16. The terminal according to claim 13, wherein the second display area is positioned in an edge of the display screen.

17. The terminal according to claim 13, wherein the second display area is positioned in a middle of a bottom of the first display area.

18. The terminal according to claim 13, wherein a thickness of the first display area is different from a thickness of the second display area.

* * * * *